United States Patent
Kido et al.

(10) Patent No.: US 6,589,673 B1
(45) Date of Patent: Jul. 8, 2003

(54) ORGANIC ELECTROLUMINESCENT DEVICE, GROUP OF ORGANIC ELECTROLUMINESCENT DEVICES

(75) Inventors: Junji Kido, 9-4-3 Umamikita, Kouryou-cho, Kitakatsuragi-gun, Nara-ken (JP); Jun Endoh, Kanagawa-ken (JP); Akira Yokoi, Kanagawa-ken (JP); Kohichi Mori, Kanagawa-ken (JP)

(73) Assignees: Junji Kido, Nara-ken (JP); International Manufacturing and Engineering Services Co., Ltd., Kanagawa-ken (JP)

( * ) Notice: Subject to any disclaimer, the term of this patent is extended or adjusted under 35 U.S.C. 154(b) by 56 days.

(21) Appl. No.: 09/675,640

(22) Filed: Sep. 29, 2000

(30) Foreign Application Priority Data

Sep. 29, 1999 (JP) .............................. 11-276933
Feb. 29, 2000 (JP) ........................ 2000-054176

(51) Int. Cl.[7] .......................... H01J 1/62; C09K 11/00; H05B 33/14
(52) U.S. Cl. ...................... 428/690; 428/212; 428/213; 428/917; 313/502; 313/506; 427/66
(58) Field of Search ............................. 428/690, 917, 428/212, 213; 313/502, 506; 427/66

(56) References Cited

U.S. PATENT DOCUMENTS

| | | | | |
|---|---|---|---|---|
| 5,281,489 A | * | 1/1994 | Mori et al. ................. | 428/690 |
| 5,283,132 A | * | 2/1994 | Ogura et al. ............... | 428/690 |
| 5,891,554 A | | 4/1999 | Hosokawa et al. ......... | 428/212 |
| 6,013,384 A | * | 1/2000 | Kido et al. ................. | 428/690 |
| 6,338,910 B1 | * | 1/2002 | Ishibashi et al. ........... | 428/690 |

FOREIGN PATENT DOCUMENTS

| | | | |
|---|---|---|---|
| EP | 0 616 488 A2 | 9/1994 | ............ H05B/33/12 |
| EP | 373582 | 3/1995 | ............ H05B/33/14 |

(List continued on next page.)

OTHER PUBLICATIONS

Organic EL Devices Doped With a Quinacridone Derivative Showing Higher Brightness and Luminescent Efficiency.
High Bright Organic Thin Film EL Devices Using a Li Alloy Cathode.
A Calcium Oxide Can be Reduced by Aluminum.
Metal Handbook p. 88.
Metal Handbook p. 87.
Polymer Light–Emitting Electrochemical Cells.
Physical Review Letters (vol. 14, No. 7).
IEEE Transactions on Electron Diodes (vol. 40, No. 7).
Organic Electroluminescent Diodes Society for Information Display International Symposium Digest of Technical Papers (vol. XXVIII).

(List continued on next page.)

Primary Examiner—Cynthia H. Kelly
Assistant Examiner—Dawn Garrett
(74) Attorney, Agent, or Firm—McCormick, Paulding & Huber LLP

(57) ABSTRACT

An organic electroluminescent device includes at least one luminescent layer, constituted from an organic compound, provided between a cathode electrode and an anode electrode opposed to the cathode electrode; and an organic compound layer doped with a metal capable of acting as an electron-donating dopant, the organic compound layer being disposed as a metal doping layer in an interfacial surface with the cathode electrode. An emission spectrum of light emitted from the organic electroluminescent device is controlled by varying a layer thickness of the metal doping layer. Alternatively, the organic compound layer can be doped with an electron-accepting compound, disposed as a chemical doping layer in an interfacial surface with the anode electrode on the luminescent layer side; wherein an emission spectrum of light emitted from the organic electroluminescent device is controlled by varying a layer thickness of the chemical doping layer.

40 Claims, 11 Drawing Sheets

FOREIGN PATENT DOCUMENTS

| | | | | |
|---|---|---|---|---|
| EP | 388768 | 8/1995 | ........... | H05B/33/14 |
| EP | 0 855 848 A2 | 7/1998 | ........... | H05B/33/14 |
| EP | 0 948 063 A2 | 10/1999 | ........... | H01L/51/20 |
| JP | 59-194393 | 11/1984 | ........... | H05B/33/14 |
| JP | 63-295695 | 12/1988 | ........... | C09K/11/06 |
| JP | 2-88689 | 3/1990 | ........... | C09K/11/06 |
| JP | 2-191694 | 7/1990 | ........... | C09K/11/00 |
| JP | 2-196885 | 8/1990 | ........... | C09K/11/06 |
| JP | 2-250292 | 10/1990 | ........... | H05B/33/14 |
| JP | 2-252793 | 10/1990 | ........... | C09K/11/06 |
| JP | 2-255789 | 10/1990 | ........... | C09K/11/06 |
| JP | 2-289676 | 11/1990 | ........... | C09K/11/06 |
| JP | 3-231970 | 10/1991 | ........... | C09B/23/00 |
| JP | 3-296595 | 12/1991 | ........... | C09K/11/06 |
| JP | 4-96990 | 3/1992 | ........... | C09K/11/06 |
| JP | 04 137485 | 5/1992 | ........... | H05B/33/14 |
| JP | 04 328295 | 11/1992 | ........... | H05B/33/14 |
| JP | 5-9470 | 1/1993 | ........... | C09K/11/06 |
| JP | 5-17764 | 1/1993 | ........... | C09K/11/06 |
| JP | 5-202011 | 8/1993 | ......... | C07D/271/10 |
| JP | 6-25659 | 2/1994 | ........... | C09K/11/06 |
| JP | 6-49079 | 2/1994 | ............ | C07F/7/10 |
| JP | 6-88072 | 3/1994 | ........... | C09K/11/06 |
| JP | 6-92947 | 4/1994 | ......... | C07D/271/10 |
| JP | 6-100857 | 4/1994 | ........... | C09K/11/06 |
| JP | 6-107648 | 5/1994 | ......... | C07D/271/10 |
| JP | 6-132080 | 5/1994 | ........... | H05B/33/14 |
| JP | 6-145146 | 5/1994 | ......... | C07D/215/30 |
| JP | 6-203963 | 7/1994 | ........... | H05B/33/22 |
| JP | 6-206865 | 7/1994 | ......... | C07D/209/86 |
| JP | 6-207170 | 7/1994 | ........... | C09K/11/06 |
| JP | 6-215874 | 8/1994 | ........... | H05B/33/22 |
| JP | 6-279322 | 10/1994 | ......... | C07C/13/547 |
| JP | 6-279323 | 10/1994 | ......... | C07C/13/567 |
| JP | 6-293778 | 10/1994 | ............ | C07F/7/10 |
| JP | 7-97355 | 4/1995 | ......... | C07C/211/54 |
| JP | 7-101911 | 4/1995 | ......... | C07C/211/61 |
| JP | 7-126225 | 5/1995 | ......... | C07C/211/54 |
| JP | 7-126226 | 5/1995 | ......... | C07C/211/54 |
| JP | 7-145116 | 6/1995 | ......... | C07C/211/54 |
| JP | 7-157473 | 6/1995 | ......... | C07D/251/24 |
| JP | 7-179394 | 7/1995 | .......... | C07C/63/72 |
| JP | 7-188130 | 7/1995 | ......... | C07C/211/54 |
| JP | 7-224012 | 8/1995 | ......... | C07C/211/61 |
| JP | 7-228579 | 8/1995 | ......... | C07D/271/10 |
| JP | 7-278124 | 10/1995 | ......... | C07D/271/10 |
| JP | 8-22557 | 1/1996 | ........... | G06T/15/00 |
| JP | 8-40995 | 2/1996 | ......... | C07C/211/54 |
| JP | 8-40996 | 2/1996 | ......... | C07C/211/54 |
| JP | 8-40997 | 2/1996 | ......... | C07C/211/54 |
| JP | 8-48656 | 2/1996 | ......... | C07C/211/54 |
| JP | 8-81472 | 3/1996 | ............. | C07F/3/00 |
| JP | 11 251067 | 9/1999 | ........... | H05B/33/22 |

OTHER PUBLICATIONS

Organic EL Cells Using Alkaline Metal Compounds as Electron Injection Materials.

Electroluminescence from Polyvinylcarbazole.

Zugang L et al.: "Effects of microcavities on the spontaneous emission of organic light–emitting diodes with ZnO:A1 as the anode" J. Phys.: Condensed Matter, 1998, vol. 10, pp. 6019–6025, XP–000964847.

So S. et al.: "Interference effects in bilayer organic light–emitting diodes", Applied Physics Letters, Apr. 5, 1999, vol. 74, No. 14, pp. 1939–1941, XP–000827174 "Vertical– Cavity Organic Light–Emitting Diode Display", IBM Technical Disclosure Bulletin, Sep. 1997, vol. 40, No. 09, pp. 165–167, XP–000735697.

Berggren M. et al.: "Polymer light–emitting diodes placed in microcavities", Synthethic Metals 76, 1996, pp. 121–123, XP–000992227.

* cited by examiner

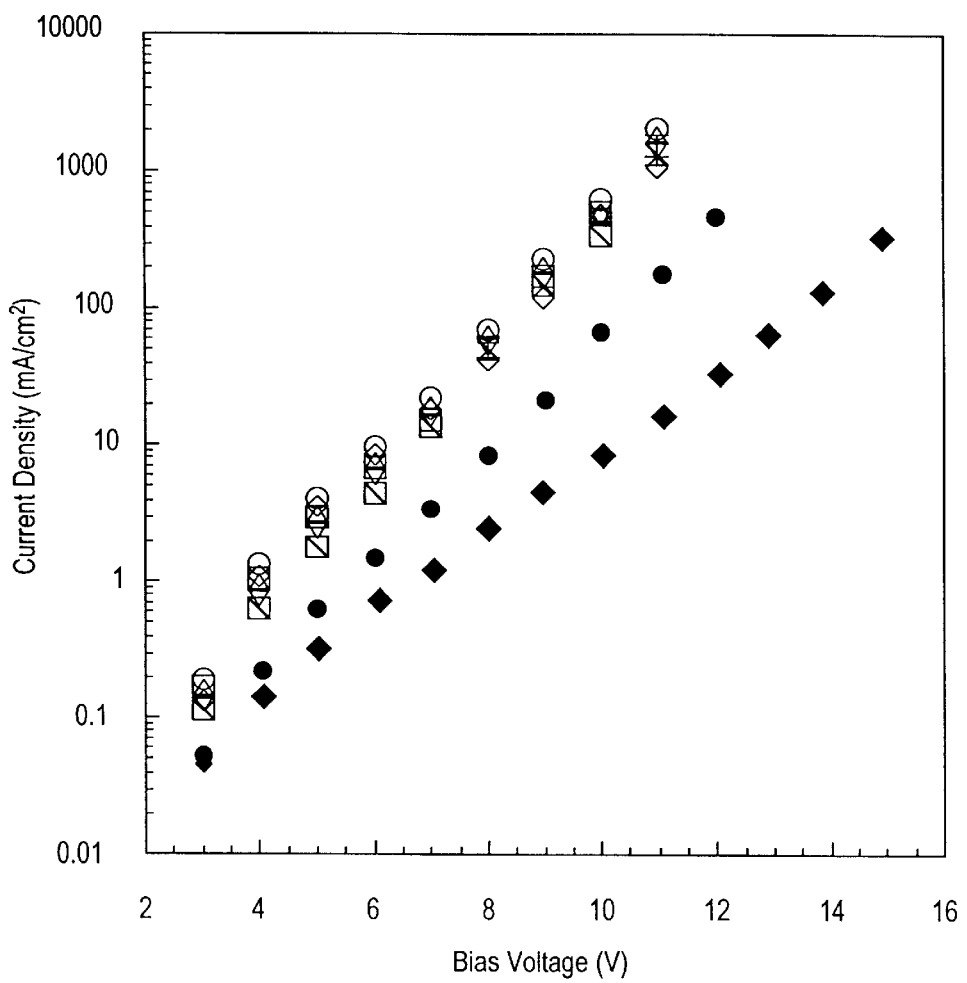

FIG. 5

A – △  Metal Doping Layer, using Bathophenanthroline (Layer Thickness of 1900 Å)
B – ⊠  Metal Doping Layeb, using Bathophenanthroline (Layer Thickness of 4800 Å)
C – ▽  Metal Doping Layer, using Bathophenanthroline (Layer Thickness of 10000 Å)
D – ◇  Metal Doping Layer, using Bathocuproine (Layer Thickness of 1900 Å)
E – □  Metal Doping Layer, using Bathocuproine (Layer Thickness of 4800 Å)
F – ○  Metal Doping Layer, using Bathocuproine (Layer Thickness of 10000 Å)
G – ●  Metal Doping Layer, using Alq (Layer Thickness of 300 Å)
H – ◆  Metal Doping Layer, using Alq (Layer Thickness of 800 Å)

A — ● Chemical Doping Layer Thickness of 3000 Å

B — ▲ Chemical Doping Layer Thickness of 2000 Å

C — □ Chemical Doping Layer Thickness of 1000 Å

D — + No Chemical Doping Layer

A — ● Chemical Doping Layer Thickness of 3000 Å

B — ▲ Chemical Doping Layer Thickness of 2000 Å

C — □ Chemical Doping Layer Thickness of 1000 Å

D — + No Chemical Doping Layer

ORGANIC ELECTROLUMINESCENT DEVICE, GROUP OF ORGANIC ELECTROLUMINESCENT DEVICES

BACKGROUND OF THE INVENTION

1. Field of the Invention

The present invention relates to an organic electroluminescent device (hereinafter, referred also to as an "organic EL device"), and a group of organic EL devices.

2. Description of the Related Art

Recently, attention is been focused on organic electroluminescent devices having a light-emitting or luminescent layer formed from a specific organic compound due such organic electroluminescent devices being able to achieve a large area display device operable at a low driving voltage. To produce an EL device having high efficiency, Tang et al., as is reported in Appl. Phys. Lett., 51, 913 (1987), have succeeded in providing an EL device having a structure in which organic compound layers having different carrier transporting properties are laminated to thereby introduce holes and electrons with a good balance from an anode and a cathode, respectively. In addition, since the thickness of the organic compound layers is less than or equal to 2,000 Å, the EL device can exhibit a high luminance and efficiency sufficient for practical use, i.e., a luminance of 1,000 cd/m$^2$ and an external quantum efficiency of 1% at an applied voltage of not more than 10 volts.

In the above-described high efficiency EL device, Tang et al. used magnesium (Mg) having a low work function in combination with the organic compound which is considered to be fundamentally an electrically insulating material, in order to reduce an energy barrier which may cause a problem during injection of electrons from a metal-made electrode. However, since the magnesium is liable to be oxidized and is unstable, and also exhibits only a poor adhesion to a surface of the organic layers, magnesium was used upon alloying, i.e., by the co-deposition of the magnesium with silver (Ag) which is relatively stable and exhibits good adhesion to a surface of the organic layers.

On the other hand, researchers of Toppan Printing Co. (cf, 51st periodical meeting, Society of Applied Physics, Preprint 28a-PB-4, p.1040) and those of Pioneer Co. (cf, 54th periodical meeting, Society of Applied Physics, Preprint 29p-ZC-15, p.1127) have had developments in the usage of lithium (Li), which has an even lower work function than that of Mg, and alloying lithium (Li) with an aluminum (Al) to obtain a stabilized cathode, thereby embodying a lower driving voltage and a higher emitting luminance in comparison with EL devices using magnesium alloys.

In addition, as is reported in IEEE Trans. Electron Devices, 40, 1342 (1993), the inventors of the present application have found that a two-layered cathode produced by depositing lithium (Li) alone with a very small thickness of about 10 Å on an organic compound layer, followed by laminating silver (Ag) to the thus deposited Li layer is effective to attain a low driving voltage in EL devices.

Using the above EL devices, as is disclosed in Japanese Unexamined Patent Publication (Kokai) No.63-264692, if a thickness of the organic compound layer is controlled to not more than 1 μm (substantially 0.2 μm or less), it becomes possible to operate the devices at a low voltage which is acceptable for practical use, even if an organic compound which is basically an electrically insulating material is used in the formation of the organic compound layer.

Further, the applicant of this application, as is disclosed in Japanese Unexamined Patent Publication (Kokai) No.10-270171, has discovered that if a metal showing a low work function such as an alkali metal, an alkali earth metal and transition metals including a rare earth metal, and an organic electron-accepting compound are mixed in the predetermined ratio through co-deposition to form an electron injection layer, the resulting EL device can be operated at a low driving voltage regardless of the work function of the cathode. In this EL device, a donor (electron-donating) dopant substance, i.e., metal, capable of acting as a reducing agent for the organic compound is previously doped into a layer of the organic compound to be contacted with the cathode, and thus the organic compound is retained as a molecule in the reduced form; namely, the molecule of the organic compound has electrons accepted or injected therein. As a result, an energy barrier in the electron injection from a cathode to an organic compound layer is reduced, thereby ensuring a low-voltage driving of the EL devices in comparison to the prior art EL devices. Moreover, in the formation of the cathode, it is possible to use any stable metals which are conventionally used as a wiring material such as aluminum (Al). Accordingly, if a suitable combination of the organic compound and the metal is applied to the metal doping layer, an increase of the driving voltage can be prevented in contrast to the prior art layer constituted from only an organic compound, and such effects can be obtained even if a layer thickness of the metal doping layer is increased to a level in the orders of micrometers. Namely, in this EL device, a dependency of the driving voltage upon layer thickness of the metal doping layer can be removed.

Referring again to the above-described EL device developed by Tang et al., an indium-tin-oxide (ITO) is coated as an anode electrode over the glass substrate. However, the use of the ITO anode electrode in the device taught by Tang et al. to obtain a good contact near to ohmic contact is considered to be made due to unexpected luck, because, in the hole injection to the organic compound, the ITO electrode has been frequently used as a transparent anode electrode made of metal oxide to satisfy the requirement for the emission of light in the planar area, and the ITO electrode can exhibit a relatively large work function of not more than 5.0 eV.

Further, in the EL device taught by Tang et al., a layer of copper phthalocyanine (hereinafter, CuPc) having a thickness of not more than 200 Å is inserted between the anode and the hole-transporting organic compound layer to further improve the contact efficiency of the anode interface region, thereby enabling the operation of the device at a low voltage.

Furthermore, the researchers of Pioneer Co., Ltd., have obtained similar effects by using a starburst type arylamine compounds, proposed by Shirota et al., of Osaka University.

CuPc compounds and starburst type arylamine compounds have characteristics that show a work function smaller than that of ITO and a relatively high mobility of the hole charge; and thus they can improve the stability of the EL devices during continuous drive, as a function of improved interfacial contact, in addition to low-voltage driving.

On the other hand, the applicant of this application and others, as is disclosed in Japanese Unexamined Patent Publication (Kokai) No.10-49771, have discovered that, if a Lewis acid compound and an organic hole-transporting compound are mixed in a predetermined ratio using a co-deposition method to form a hole injection layer, the resulting EL device can be operated at a low driving voltage regardless of the work function of the anode. In this EL device, a Lewis acid compound capable of acting as an oxidation agent for the organic compound is previously doped into a layer of the organic compound to be contacted with the anode, and thus the organic compound is retained as a molecule in an oxidized form. As a result, an energy barrier in the hole injection from an anode to an organic compound layer is reduced, thereby ensuring a low-voltage driving of the EL devices in comparison to the prior art EL devices. Accordingly, if a suitable combination of the organic compound and the Lewis acid compound is applied to the hole injection layer, an increase of the driving voltage can be avoided in contrast to the prior art layer constituted from only an organic compound, and such effects can be obtained even if a layer thickness of the hole injection layer is increased to a level in the order of micrometers. Namely, in this EL device, a dependency of the driving voltage upon the layer thickness of the hole injection layer can be removed. Details of this EL device should be referred to a preprint of 47th periodical meeting of Japanese Society of Polymer, Vol.47, No.9, p.1940 (1998).

In addition, there have been made other approaches to improve the organic EL devices, because an emission spectrum of the EL devices relies upon the fluorescence generated by the organic dyes, and thus a half-width thereof is generally large. The large half-width of the emission spectrum is insufficient to satisfy the requirements for tone control of the devices.

As is disclosed in Japanese Unexamined Patent Publication (Kokai) No.8-213174, Nakayama et al., of Hitachi Ltd., have succeeded in giving an optical resonator function to the EL device, thereby improving the purity of color of light emitted from the device. The invention taught provides a translucent reflective layer between a glass substrate and a transparent ITO electrode to control an optical distance (length of optical path) between a light emission layer and a back electrode (anode).

The layer structure similar to that of Nakayama et al., was also adopted by Tokitoh et al., of Kabushikikaisha Toyota Chuo Kenkyusho. Namely, as is disclosed in Japanese Unexamined Patent Publication (Kokai) No.9-180883, Tokitoh et al. have determined a length of the optical path using a similar layer structure to obtain a single emission mode, thereby ensuring a monochromaticity and a strong directivity in a front direction.

As will be appreciated, both of the above EL devices have a layer structure in which a translucent reflective layer is sandwiched between a transparent electrically conducting layer as an anode and a glass substrate, the translucent reflective layer being formed by alternately depositing thin layers having different indexes of refraction such as $TiO_2$ and $SiO_2$ with sputtering or the like, and an optical resonator structure is formed between the reflective layer and the anode as a reflecting mirror. However, when it is intended to form a charge injection layer in these EL devices by using only an organic compound as in the prior art organic EL devices, to obtain a effective length of optical path sufficient to utilize an interference effect of light, it is necessary to provide a translucent reflective layer in accordance with the above-mentioned manner, in addition to formation of the organic layer.

SUMMARY OF THE INVENTION

The present invention is designed to solve the above-mentioned problems of the EL devices of the prior art, wherein an object of the present invention is to provide an EL device wherein the driving voltage can be reduced by forming an electron injection layer to be contacted with a cathode as a metal doping layer, or by forming a hole injection layer to be contacted with an anode as a chemical doping layer; and, at the same time, to utilize the lack of dependency of the driving voltage upon the layer thickness of the metal doping layer or chemical doping layer, to thereby function as an emission spectrum controlling layer to the electron injection layer or hole injection layer.

In order to achieve the above-mentioned object, an organic electroluminescent device is provided, including at least one luminescent layer, constituted from an organic compound, provided between a cathode electrode and an anode electrode opposed to the cathode electrode; and an organic compound layer doped with a metal capable of acting as an electron-donating dopant, the organic compound layer being disposed as a metal doping layer in an interfacial surface with the cathode electrode. An emission spectrum of light emitted from the organic electroluminescent device is controlled by varying a layer thickness of the metal doping layer.

Preferably, the metal doping layer includes at least one metal selected from an alkali metal, an alkali earth metal and transition metals including a rare earth metal, the metal having a work function of not more than 4.2 eV.

Preferably, the metal is included in the metal doping layer by a molar ratio of 0.1 to 10 with respect to the organic compound.

Preferably, the metal doping layer has a layer thickness of not less than 500 angstroms.

In an embodiment, the organic compound in the metal doping layer can act as a ligand to an ion of the metal in the metal doping layer.

In an embodiment, the metal doping layer includes divided areas having different layer thicknesses.

Preferably, the divided areas each includes a group of picture elements arranged in a matrix form.

Preferably, each of the divided areas has a controlled layer thickness to obtain a specific emission spectrum in each divided area.

According to another aspect of the present invention, a group of organic electroluminescent devices are provided, each organic electroluminescent device including at least one luminescent layer, constituted from an organic compound, provided between a cathode electrode and an anode electrode opposed to the cathode electrode; and an organic compound layer doped with a metal capable of acting as an electron-donating dopant, the organic compound layer being disposed as a metal doping layer in an interfacial surface with the cathode electrode. A layer thickness of the metal doping layer is controlled in each organic electroluminescent device so that light emitted from the each organic electroluminescent device has different emission spectrums.

Preferably, the metal doping layer includes at least one metal selected from an alkali metal, an alkali earth metal and transition metals including a rare earth metal, the metal having a work function of not more than 4.2 eV.

Preferably, the metal is included in the metal doping layer by a molar ratio of 0.1 to 10 with respect to the organic compound.

Preferably, the metal doping layer has a layer thickness of not less than 500 angstroms.

Preferably, the organic compound in the metal doping layer can act as a ligand to an ion of the metal in the metal doping layer.

According to another aspect of the present invention, an organic electroluminescent device is provided, including at least one luminescent layer, constituted from an organic compound, provided between a cathode electrode and an anode electrode opposed to the cathode electrode; and an organic compound layer doped with an electron-accepting compound, having properties of a Lewis acid, disposed as a chemical doping layer in an interfacial surface with the anode electrode on the luminescent layer side. An emission spectrum of light emitted from the organic electroluminescent device is controlled by varying a layer thickness of the chemical doping layer.

In an embodiment, the chemical doping layer is a layer of organic compound formed upon doping, through co-deposition in a vacuum, of the electron-accepting compound.

In another embodiment, the chemical doping layer is prepared by reacting an organic compound and the electron-accepting compound in a solution.

Preferably, the organic compound constituting the organic compound layer is a polymer.

In an embodiment, the organic compound layer includes the electron-accepting compound by a molar ratio of 0.1 to 10 with respect to the organic compound constituting the organic compound layer.

In an embodiment, the organic compound layer includes the electron-accepting compound by a molar ratio of 0.1 to 10 with respect to an active unit of the polymer constituting the organic compound layer.

Preferably, the chemical doping layer has a layer thickness of not less than 50 angstroms.

In an embodiment, the electron-accepting compound includes an inorganic compound.

Preferably, the inorganic compound includes at least one member selected from a group consisting of ferric chloride, aluminum chloride, gallium chloride, indium chloride and antimony pentachloride.

In another embodiment, the electron-accepting compound includes an organic compound.

In an embodiment, the organic compound includes trinitrofluorenone.

Preferably, the chemical doping layer includes divided areas having different layer thicknesses.

Preferably, each of the divided areas includes a group of picture elements arranged in a matrix form.

Preferably, wherein each of the divided areas has a controlled layer thickness to obtain a specific emission spectrum in each divided area.

According to another aspect of the present invention, a group of organic electroluminescent devices is provided, each organic electroluminescent device including at least one luminescent layer, constituted from an organic compound, provided between a cathode electrode and an anode electrode opposed to the cathode electrode. The organic electroluminescent devices each includes an organic compound layer, as a chemical doping layer, doped with an electron-accepting compound having properties of a Lewis acid, the organic compound layer being disposed in an interfacial surface with the anode electrode on the luminescent layer side of the organic electroluminescent device. A layer thickness of the chemical doping layer is varied in the each organic electroluminescent device so that light emitted from the organic electroluminescent device has different emission spectrums.

In an embodiment, the chemical doping layer is a layer of organic compound formed upon doping, through co-deposition in a vacuum, of the electron-accepting compound.

In another embodiment, the chemical doping layer is a layer of organic compound formed upon coating a coating solution which is prepared by reacting an organic compound constituting the organic compound layer and the electron-accepting compound in a solution.

Preferably, the organic compound constituting the organic compound layer is a polymer.

In an embodiment, the organic compound layer includes the electron-accepting compound by a molar ratio of 0.1 to 10 with respect to the organic compound constituting the organic compound layer.

In an embodiment, the organic compound layer includes the electron-accepting compound by a molar ratio of 0.1 to 10 with respect to an active unit of the polymer constituting the organic compound layer.

Preferably, the chemical doping layer has a layer thickness of not less than 50 angstroms.

In an embodiment, the electron-accepting compound includes an inorganic compound.

In another embodiment, the electron-accepting compound includes an organic compound.

The present disclosure relates to subject matter contained in Japanese Patent Applications No.11-276933 (filed on Sep. 29, 1999) and No.2000-54176 (filed on Feb. 29, 2000) which are expressly incorporated herein by reference in their entireties.

BRIEF DESCRIPTION OF THE DRAWINGS

The present invention will be more clearly understood from the description as set forth below with reference to the accompanying drawings, wherein:

FIG. 5 is a graph showing the relationship between the bias voltage and the electric current for an organic EL device of the first embodiment of the present invention and the organic EL device of a comparative example;

DESCRIPTION OF THE PREFERRED EMBODIMENTS

The present invention will be further described with reference to the preferred embodiments for carrying out the present invention.

Figure 1:
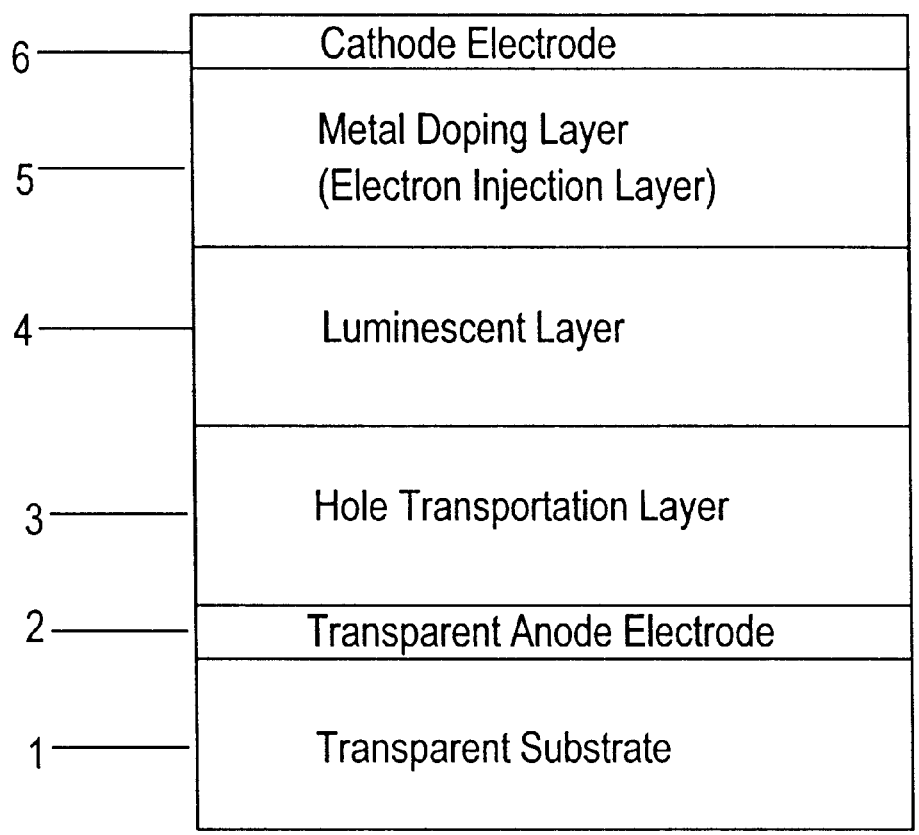
FIG. 1 is a cross-sectional view illustrating a lamination structure of an organic EL device according the first embodiment of the present invention.

FIG. 1 is a schematic cross-sectional view illustrating the organic EL device according to the first aspect of the present invention. A glass substrate (transparent substrate) 1 includes, laminated in the following order on a surface thereof, a transparent anode electrode 2, a hole transportation layer 3 having a hole-transporting property, a luminescent layer 4, a metal doping layer 5 and a cathode electrode 6. Among these EL device elements (layers), the glass substrate (transparent substrate) 1, the transparent anode electrode 2, the hole transportation layer 3, the luminescent layer 4 and the cathode electrode 6 each is well-known in conventional organic EL devices, whereas the metal doping layer 5 is the specific EL device element suggested by the first aspect of the present invention.

In addition to the illustrated lamination structure of the EL device, the organic EL device of the first aspect of the present invention may include other lamination structures such as: anode/luminescent layer/metal doping layer/cathode, anode/hole transportation layer/luminescent layer/metal doping layer/cathode, anode/hole transportation layer/luminescent layer/electron transportation layer/metal doping layer/cathode, anode/hole injection layer/luminescent layer/metal doping layer/cathode, anode/hole injection layer/hole transportation layer/luminescent layer/metal doping layer/cathode, anode/hole injection layer/hole transportation layer/luminescent layer/electron transportation layer/metal doping layer/cathode, and others. The organic EL device of the first aspect of the present invention may have any lamination structure, as long as the metal doping layer 5 is positioned in an interfacial surface with the cathode electrode 6.

In the organic EL device, an electron injection process from a cathode electrode to an organic compound layer, which is fundamentally an electrically insulating material, is based on a reduction of the organic compound in a surface of the cathode electrode, i.e., formation of the radical anion state (cf. Phys. Rev. Lett., 14, 229 (1965)). In the organic EL device of the first aspect of the present invention, since a donor (electron-donating) dopant substance which can act as a reducing agent for the organic compound, i.e., metal, is previously doped in an organic compound layer contacting the cathode electrode, an energy barrier during the electron injection from the cathode to the organic compound layer can be reduced. The metal doping layer 5 of the illustrated EL device is an organic compound layer which has been doped with a metal capable of acting as a donor dopant in the manner mentioned above. Because the metal doping layer contains molecules which have been already reduced with the dopant, namely, the molecules of the metal doping layer have the electron(s) accepted therein or injected thereto, its energy barrier of the electron injection is small, and thus it is possible to reduce a driving voltage of the EL device in comparison to EL devices of the prior art. In addition, it is possible to use a stable metal material such as aluminum (Al) as a cathode material of the EL device, which is a conventional wiring material. In this case, the donor dopant used is not restricted to any particular dopant, so long as it can reduce the organic compound. Preferably, the donor dopant is an alkali metal such as Li or the like, an alkali earth metal such as Mg or the like, and transition metals including a rare earth metal; in other words, any metal having a work function of not more than 4.2 eV can be suitably used as the donor dopant. Typical examples of such suitable metals include Li, Na, K, Rb, Cs, Be, Mg, Ca, Sr, Ba, Y, La, Sm, Eu, Gd, and Yb.

In the above metal doping layer, a concentration of the donor dopant may be widely varied depending upon the desired effects and other factors, however, it is preferred that the dopant is contained in a molar ratio of 0.1 to 10 with respect to the organic compound in the metal doping layer. A dopant concentration of less than 0.1 will show insufficient doping effect due to excessively reduced concentration of the molecules reduced with the dopant (hereinafter, referred also to as "reduced molecules"), whereas a concentration of more than 10 will also show insufficient doping effect due to considerable reduction of the concentration of the reduced molecules as a function of notable increase of metal concentration in comparison with the concentration of the organic molecules in the layer. Further, in principle, the metal doping layer has no upper limit in its layer thickness.

The formation of the metal doping layer 5 may be carried out by using any conventional methods for forming thin films including, for example, a vapor deposition method and a sputtering method. In addition to these methods, if the metal doping layer 5 can be formed from a coating solution, the metal doping layer 5 may be formed by using any coating method; such as spin coating, dip coating and the like. In such a layer formation process, an organic compound to be doped and a dopant may be dispersed in an inactive polymeric material.

In the production of the organic EL device, the organic compounds used in the formation of the luminescent layer, the electron transportation layer and the metal doping layer are not restricted to any specific compounds However, typical examples of suitable organic compounds include polycyclic compounds such as p-terphenyl and quaterphenyl as well as derivatives thereof; condensed polycyclic hydrocarbon compounds such as naphthalene, tetracene, pyrene, coronene, chrysene, anthracene, diphenylanthracene, naphthacene and phenanthrene as well as derivatives thereof; condensed heterocyclic compounds such as phenanthroline, bathophenanthroline, phenanthridine, acridine, quinoline, quinoxaline, phenazine and the like as well as derivatives thereof; and fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diarminocarbazole, pyrane, thiopyrane, polymethine, merocyanine, quinacridone and rubrene as well as derivatives thereof.

In addition to these organic compounds, metal-chelated complex compounds described in Japanese Unexamined Patent Publication (Kokai) Nos. 63-295695, 8-22557, 8-81472, 5-9470 and 5-17764 may be suitably used as the organic compounds. Among these metal-chelated complex compounds, metal-chelated oxanoide compounds, for example, metal complexes which contain, as a ligand thereof, at least one member selected from 8-quinolinolato such as tris(8-quinolinolato)aluminum, bis(8-quinolinolato) magnesium, bis[benzo(f)-8-quinolinolato]zinc, bis(2-methyl-8-quinolinolato)aluminum, tri(8-quinolinolato)

indium, tris(5-methyl-8-quinolinolato)aluminum, 8-quinolinolatolithium, tris(5-chloro-8-quinolinolato) gallium and bis(5-chloro-8-quinolinolato)calcium as well as derivatives thereof can be suitably used.

Further, oxadiazoles disclosed in Japanese Patent Kokai Nos. 5-202011, 7-179394, 7-278124 and 7-228579, triazines disclosed in Japanese Patent Kokai No. 7-157473, stilbene derivatives and distyrylarylene derivatives disclosed in Japanese Patent Kokai No. 6-203963, styryl derivatives disclosed in Japanese Patent Kokai Nos. 6-132080 and 6-88072, and diolefin derivatives disclosed in Japanese Patent Kokai Nos.6-100857 and 6-207170 are preferably used in the formation of the luminescent layer and the electron transportation layer.

Furthermore, a fluorescent whitening agent such as benzoxazoles, benzothiazoles and benzoimidazoles may be used as the organic compounds, and it includes, for example, those described in Japanese Patent Kokai No. 59-194393. Typical examples of the fluorescent whitening agent include the fluorescent whitening agents classified under the group of benzoxazoles such as 2,5-bis(5,7-di-t-pentyl-2-benzoxazolyl)-1,3,4-thiazole, 4,4'-bis(5,7-t-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl) thiophene, 2,5-bis[5-($\alpha,\alpha$-dimethylbenzyl)-2-benzoxazolyl]thiophene, 2,5-bis[5,7-di(2-methyl-2-butyl)-2-benzoxazolyl]-3,4-diphenylthiophene, 2,5-bis(5-methyl-2-benzoxazolyl)thiophene, 4,4'-bis(2-benzoxazolyl) biphenyl, 5-methyl-2-{2-[4-(5-methyl-2-benzoxazolyl) phenyl]vinyl}benzoxazole and 2-[2-(4-chlorophenyl)vinyl] naphtho(1,2-d)oxazole; under the group of benzothiazoles such as 2,2'-(p-phenylenedipynylene)-bisbenzothiazole; and under the group of benzoimidazoles such as 2-{2-[4-(2-benzoimidazolyl)phenyl]vinyl}benzoimidazole and 2-[2-(4-carboxyphenyl)vinyl]benzoimidazole.

As the distyrylbenzene compound, the compounds disclosed in European Patent No. 373,582 may be used, for example. Typical examples of the distyrylbenzene compound include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene and 1,4-bis(2-methylstyryl)-2-ethylbenzene.

Furthermore, distyrylpyrazine derivatives disclosed in Japanese Patent Kokai No. 2-252793 may also be used in the formation of the luminescent layer, the electron transportation layer and the metal doping layer. Typical examples of the distyrylpyrazine derivatives include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine and 2,5-bis [2-(1-pyrenyl)vinyl]pyrazine.

In addition, dimethylidine derivatives disclosed in European Patent No. 388,768 and Japanese Patent Kokai No. 3-231970 may also be used as the material of the luminescent layer, the electron transportation layer and the metal doping layer. Typical examples of the dimethylidine derivatives include 1,4-phenylenedimethylidine, 4,4'-phenylenedimethylidine, 2,5-xylylenedimethylidine, 2,6-naphthylenedimethylidine, 1,4-biphenylenedimethylidine, 1,4-p-terephenylenedimethylidine, 9,10-anthracenediyldimethylidine, 4,4'-(2,2-di-t-butylphenylvinyl)biphenyl and 4,4'-(2,2-diphenylvinyl) biphenyl as well as derivatives thereof; silanamine derivatives disclosed in Japanese Patent Kokai Nos. 6-49079 and 6-293778; polyfunctional styryl compounds disclosed in Japanese Patent Kokai Nos. 6-279322 and 6-279323; oxadiazole derivatives disclosed in Japanese Patent Kokai Nos. 6-107648 and 6-92947; anthracene compounds disclosed in Japanese Patent Kokai No. 6-206865; oxynate derivatives disclosed in Japanese Patent Kokai No. 6-145146; tetraphenylbutadiene compounds disclosed in Japanese Patent Kokai No. 4-96990; and organic trifunctional compounds disclosed in Japanese Patent Kokai No. 3-296595; as well as coumarin derivatives disclosed in Japanese Patent Kokai No. 2-191694; perylene derivatives disclosed in Japanese Patent Kokai No. 2-196885; naphthalene derivatives disclosed in Japanese Patent Kokai No. 2-255789; phthaloperynone derivatives disclosed in Japanese Patent Kokai Nos. 2-289676 and 2-88689; and styrylamine derivatives disclosed in Japanese Patent Kokai No. 2-250292.

Moreover, any well-known conventional compounds in the production of EL devices of the prior art may be suitably used as the organic compound in the production of the EL device of the present invention.

The arylamine compounds used in the formation of the hole injection layer, the hole transportation layer and the hole-transporting luminescent layer, although they are not restricted thereto, preferably include the arylamine compounds disclosed in Japanese Patent Kokai Nos. 6-25659, 6-203963, 6-215874, 7-145116, 7-224012, 7-157473, 8-48656, 7-126226, 7-188130, 8-40995, 8-40996, 8-40997, 7-126225, 7-101911 and 7-97355. Typical examples of suitable arylamine compounds include N,N,N',N'-tetraphenyl-4,4'-diaminophenyl, N, N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostilbenzene, N-phenylcarbazole, 1,1-bis(4-di-p-triaminophenyl) cyclohexane, 1,1-bis(4-di-p-triaminophenyl)-4-phenylcyclohexane, bis(4-dimethylamino-2-methylphenyl) phenylmethane, N,N,N-tri(p-tolyl)amine, 4-(di-p-tolylamino)-4'-[4-(di-p-tolylamino)styryl]stilbene, N,N,N', N'-tetraphenyl-4,4'-diaminobiphenyl N-phenylcarbazole, 4,4'-bis[N-(1-naphthyl)-N-phenylamino]biphenyl, 4,4"-bis [N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenyl, 4,4"-bis(N-(1-anthryl)-N-phenylamino]p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino) naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4'-bis{N-phenyl-N-[4-(1-naphthyl)phenyl]amino}biphenyl, 4,4'-bis [N-phenyl-N-(2-pyrenyl)amino]biphenyl, 2,6-bis[N,N-di(2-naphthyl)amino]fluorene, 4,4"-bis(N,N-di-p-tolylamino) terphenyl and bis(N-1-naphthyl)(N-2-naphthyl)amine. Also, any well-known arylamine compounds which are conventional in the production of the prior art EL devices may be suitably used if desired.

Further, in the formation of the hole injection layer, the hole transportation layer and the hole-transporting luminescent layer, a dispersion of the above-described organic compounds in a polymer or a polymerized product of the organic compounds may be used as the layer material. Also, so-called "π-conjugated polymers" such as polyparaphenylene vinylene and its derivatives, hole-transporting non-conjugated polymers, typically poly(N-vinylcarbazole), and σ-conjugated polymers of polysilanes may be used as the layer material.

The material of the hole injection layer to be deposited over the ITO electrode is not restricted to any specific material, however, metal phthalocyanines such as copper phthalocyanine as well as non-metal phthalocyanines, carbon films and electrically conductive polymers such as polyanilines may be preferably used in the formation of the hole injection layer. Alternatively, the hole injection layer may be formed by reacting the above-described arylamine compounds with a Lewis acid as an oxidizing agent to generate radical cations therein.

The material of the cathode electrode is not limited, so long as the material is a metal capable of being stably used in air. In particular, a suitable cathode material is aluminum, which is conventionally and widely used as the wiring electrode.

Figure 7:
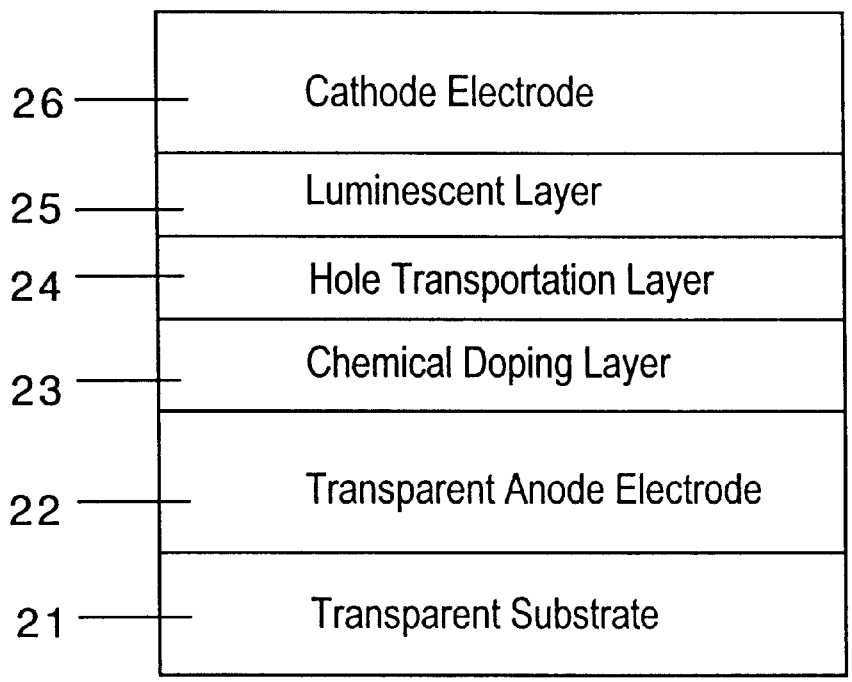
FIG. 7 is a cross-sectional view illustrating a lamination structure of an organic EL device according to a second embodiment of the present invention.

FIG. 7 is a schematic cross-sectional view illustrating the organic EL device according to the second aspect of the present invention. A glass substrate (transparent substrate) 21 includes, laminated in the following order on a surface thereof, a transparent anode electrode 22, a chemical doping layer 23 doped with a Lewis acid compound (electron-accepting compound), a hole transportation layer 24 having a hole-transporting property, a luminescent layer 25 and a cathode electrode 26. Among these EL device elements (layers), the glass substrate (transparent substrate) 21, the transparent anode electrode 22, the hole transportation layer 24, the luminescent layer 25 and the cathode electrode 26 each is well-known in conventional organic EL devices, whereas the chemical doping layer 23 is the specific EL device element suggested by the second aspect of the present invention.

In addition to the illustrated lamination structure of the EL device, the organic EL device of the second aspect of the present invention may include other lamination structures such as anode/chemical doping layer/hole transportation layer/luminescent layer/electron transportation layer/cathode, anode/chemical doping layer/luminescent layer/electron injection layer/cathode, and anode/chemical doping layer/hole transportation layer/luminescent layer/electron transportation layer/electron injection layer/cathode. The organic EL device of the second aspect of the present invention may have any lamination structure, as long as the chemical doping layer 23 doped with the Lewis acid compound is positioned in an interfacial surface with the anode electrode 22.

In the organic EL device, a process of the hole injection from an anode electrode to an organic compound layer which is basically an electrically insulating material is based on an oxidation of the organic compound in a surface of the anode electrode, that is, formation of the radical cation state (cf. Phys. Rev. Lett., 14, 229 (1965)). In the organic EL device of the second aspect of the present invention, since an electron-accepting compound, which has properties of a Lewis acid, and thus can act as an oxidation agent for the organic compound, is previously doped in an organic compound layer contacting the anode electrode, an energy barrier during the electron injection from the anode electrode to the organic compound layer can be reduced. The chemical doping layer 23 of the illustrated EL device is an organic compound layer which has been doped with an electron-accepting compound having properties of a Lewis acid in the manner mentioned above. Because the chemical doping layer contains molecules which have been already oxidized with the dopant, its energy barrier of the hole injection is small, and thus it is possible to reduce a driving voltage of the device in comparison to the prior art EL devices. In this case, the Lewis acid may include any one or more of the compounds capable of oxidizing an organic compound such as an inorganic compound, for example, ferric chloride, aluminum chloride, gallium chloride, indium chloride, antimony pentachloride and the like, and an organic compound, for example, trinitrofluorenone and the like.

In the above chemical doping layer, a concentration of the Lewis acid as the dopant may be widely varied depending upon the desired effects and other factors; however, it is preferred that the Lewis acid is contained in a molar ratio of 0.1 to 10 with respect to the organic compound in the chemical doping layer. The Lewis acid concentration of less than 0.1 will show insufficient doping effect due to excessively reduced concentration of the molecules oxidized with the dopant (hereinafter, referred also to as "oxidized molecules"), whereas the concentration of more than 10 will also show insufficient doping effect due to remarkable reduction of the concentration of the oxidized molecules as a function of notable increase of the Lewis acid concentration in comparison with the concentration of the organic molecules in the layer. Further, in principle, the chemical doping layer has no upper limit in its layer thickness.

In the production of the organic EL device, the organic compounds used in the formation of the chemical doping layer, the hole transportation layer and the hole-transporting luminescent layer are not restricted to the specified compounds. They may be the same as those used in the formation of the hole injection layer, the hole transportation layer and the hole-transporting luminescent layer in the above-described EL device of the first aspect of the present invention.

Similarly, the organic compounds used in the formation of the luminescent layer, the electron transportation layer and the electron injection layer are not restricted to the specified compounds. They may be the same as those used in the formation of the luminescent layer, the electron transportation layer and the metal doping layer in the above-described EL device of the first aspect of the present invention.

As in the above-described EL device of the first aspect of the present invention, the material of the anode electrode of the second aspect of the present invention is not limited, so long as the anode electrode is a metal capable of being stably used in air. In particular, a suitable anode material is aluminum which is conventionally and widely used as the wiring electrode.

EXAMPLES

The present invention will be further described with reference to the following examples, however, it should be noted that the present invention is not restricted by these examples.

Examples According to the First Aspect of the Present Invention

In the following examples, the first aspect of the present invention will be described. In these examples, vapor deposition of the organic compound and the metal was carried out by using the vapor deposition apparatus "VPC-400" commercially available from Shinkuu Kikou Co. The thickness of the deposited layers was determined by using the profilometer "DekTak3ST" commercially available from Sloan Co. Further, the characteristics of the organic EL device were determined by using the source meter "2400" commercially available from Keithley & Co., and the luminance meter "BM-8" commercially available from Topcon Co. A DC voltage was applied in steps at an increasing rate of one volt per 2 seconds to the EL device having an ITO anode and an aluminum (Al) cathode, and the luminance and the electric current were determined after one second had passed from the completion of each increase of the voltage. The EL spectrum was determined by using the optical multichannel analyzer "PMA-11", commercially available from Hamamatsu Photonics Co., driven at a constant electric current.

Example 1

The organic EL device having the lamination structure illustrated in FIG. 1 was produced according to the present invention.

A glass substrate 1 was coated with an ITO (indium-tin oxide) layer having a sheet resistance of about 25 Ω/□, commercially available as a sputtered product from Sanyou Shinkuu Co., to form a transparent anode electrode 2. Alpha (α)-NPD having a hole transporting property, represented by the following formula (I), was deposited onto the ITO-coated glass substrate 1 under vacuum of about $10^{-6}$ Torr and at the deposition rate of about 2 Å/sec to form a hole transportation layer 3 having a thickness of about 500 Å.

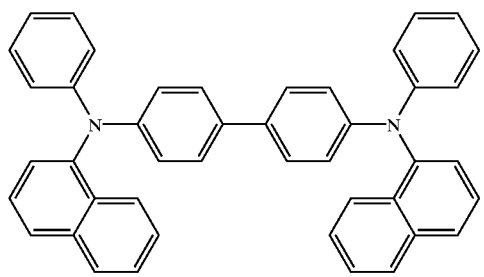
(I)

Subsequently, an aluminum complex of tris(8-quinolinolato) (hereinafter abbreviated as "Alq") capable of exhibiting a green luminescence, represented by the following formula (II), was deposited onto the hole transportation layer 3 under the same vacuum vapor deposition conditions as in the above-described deposition of the hole transportation layer 3 to form a luminescent layer 4 having a thickness of about 400 Å.

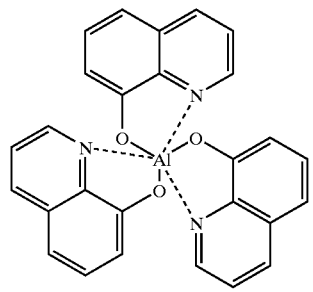
(II)

After the formation of the luminescent layer 4, to form a metal doping layer 5 thereon, bathophenanthroline represented by the following formula (III) and lithium in a molar rio of 1:1 were co-posited under the a controlled deposition rate to obtain athe described molar ratio onto the luminescent layer 4. The metal doping layer 5 having a thickness of about 300 Å was thus obtained.

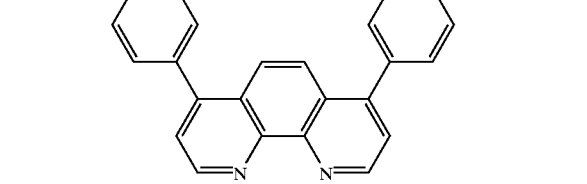
(III)

Finally, alminum (Al) was deposited at the deposition rate of about 10 Å/sec onto the metal doping layer 5 to form a cathode electrode 6 having a thickness of about 1,000 Å. The organic EL device having a square luminescent area of about 0.5 cm (length) by about 0.5 cm (width) was thus obtained.

Figure 2:
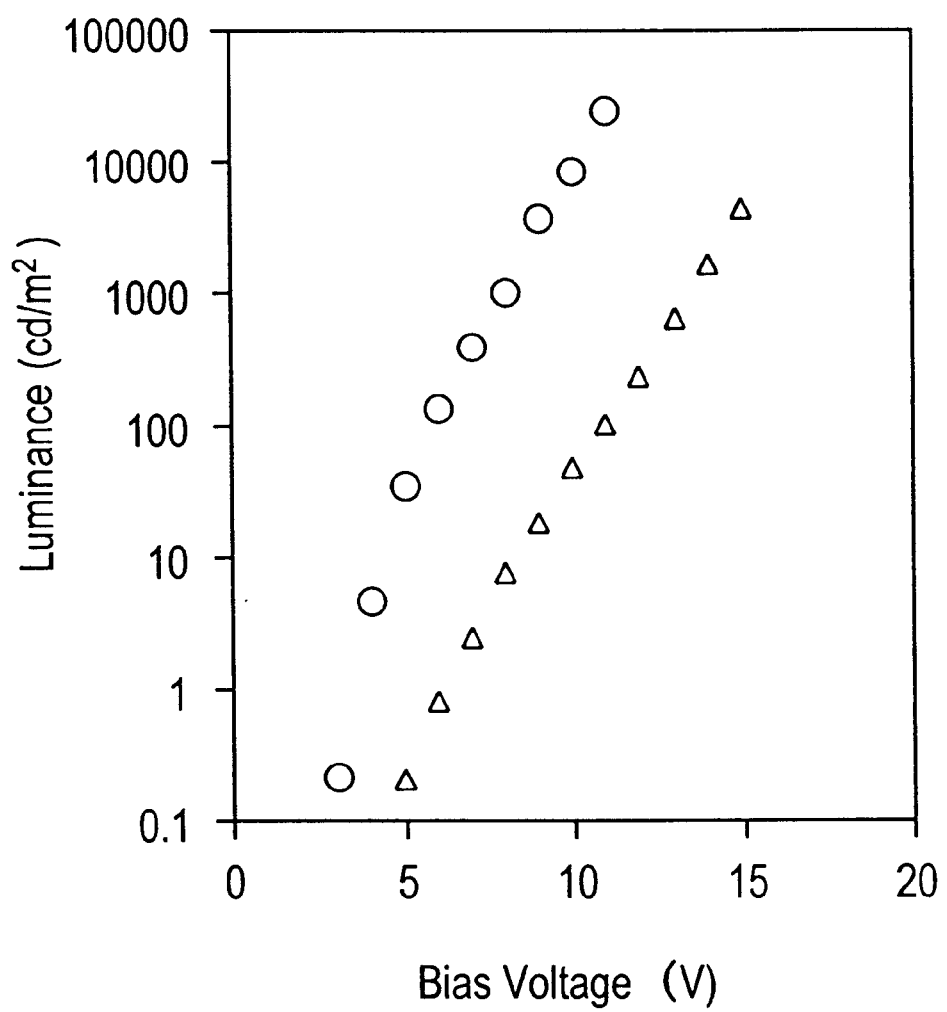
FIG. 2 is a graph showing the relationship between the bias voltage and the luminance for an organic EL device of the first embodiment of the present invention and the organic EL device of a comparative example.
Figure 3:
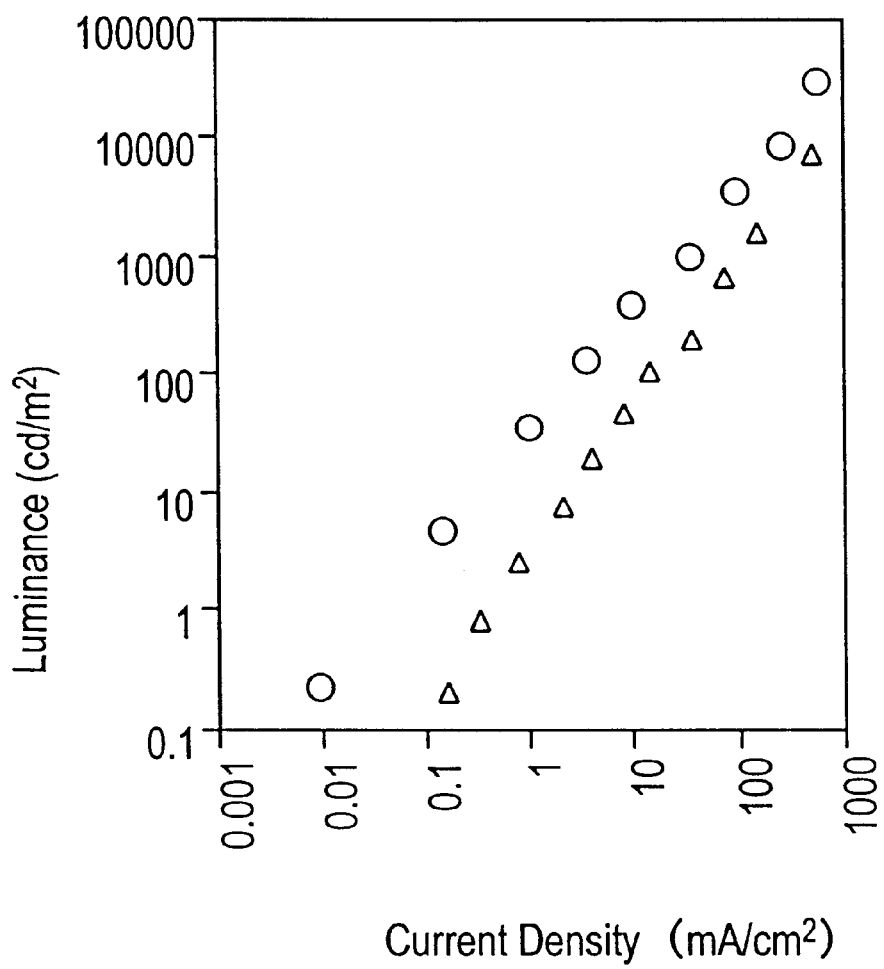
FIG. 3 is a graph showing the relationship between the current density and the luminance for an organic EL device of the first embodiment of the present invention and the organic EL device of a comparative example.

In the produced organic EL device, a DC voltage was applied to between the transparent anode electrode (ITO) 2 and the cathode electrode (Al) 6, and a luminance of the green luminescence from the luminescent layer (Alq) 4 was determined to obtain the results plotted with white circles in FIGS. 2 and 3. It can be appreciated from FIG. 2, showing the relationship between the bias voltage and the luminance of the EL device, and FIG. 3, showing the relationship between the current density and the luminance of the EL device, that a high luminance of at most about 28,000 cd/m² could be obtained at the applied bias voltage of 11 volts and at the current density of about 600 mA/cm², and that a luminance of about 1,000 cd/m² could be obtained at the applied bias voltage of about 7 volts. Further, it was found from the observation of the emission spectrum that the emission spectrum is identical with the fluorescent spectrum of Alq (see, the solid line in the graph of FIG. 4).

Comparative Example 1

The procedure of Example 1 was repeated to produce an organic EL device with the proviso that, for the purpose of comparison, a metal doping layer 5 is omitted from the device. Namely, α-NPD was first deposited onto the ITO-coated glass substrate to form a hole transportation layer having a thickness of about 500 Å, and then Alq was deposited under the same vacuum deposition conditions as in the deposition of the hole transportation layer to form a luminescent layer having a thickness of about 700 Å. Thereafter, aluminum (Al) was deposited at a thickness of about 1,000 Å over the luminescent layer to form a cathode electrode. The organic EL device was thus obtained.

In the produced organic EL device, the luminance of the green luminescence from the luminescent layer was determined as in Example 1 to obtain the results plotted with triangular symbols in FIGS. 2 and 3. It can be appreciated from FIG. 2, showing the relationship between the bias voltage and the luminance of the EL device, and FIG. 3, showing the relationship between the current density and the luminance of the EL device, that only a luminance of at most about 4,700 $cd/m^2$ was obtained at the increased applied bias voltage of 15 volts, and the applied bias voltage of about 13 volts was required to obtain a luminance of about 1,000 $cd/m^2$.

The results of FIGS. 2 and 3 indicate that the presence of a metal doping layer in the EL devices is effective to reduce the driving voltage of the devices.

Example 2

The procedure of Example 1 was repeated to produce an organic EL device with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 400 Å.

Thereafter, to obtain metal doping layers 5 having different layer thicknesses, bathophenanthroline and lithium in a molar ratio of 1:1 were co-deposited under a controlled deposition rate to obtain the described molar ratio onto the luminescent layer 4. Three metal doping layers 5 having thicknesses of about 1,900 Å, 4,800 Å and 10,000 Å (1 μm) were thus obtained.

Thereafter, aluminum (Al) was deposited at a thickness of about 1,000 Å on the metal doping layer 5 to form a cathode electrode 6.

The thus produced organic EL device was tested to obtain the results plotted in FIG. 5 showing the relationship between the bias voltage and the current density of the device. Note, in this graph, Symbols A, B and C represent metal doping layers having the layer thicknesses of 1,900 Å, 4,800 Å and 10,000 Å (1 μm), respectively.

It was found from the above tests that if bathophenanthroline is used as the organic compound in the formation of the metal doping layer 5 of the EL device, a driving voltage of the device is not increased with the increase of the layer thickness of the layer 5, since the organic compound has a function of acting as a ligand with respect to the metal ion to be doped into the layer 5. Further, observation of the emission spectrum indicated that the emission spectrum from Alq was modified due to the interference effect with the reflected light on the cathode electrode, thereby enabling to control a purity and tone of the color of the emitted light.

Figure 4:
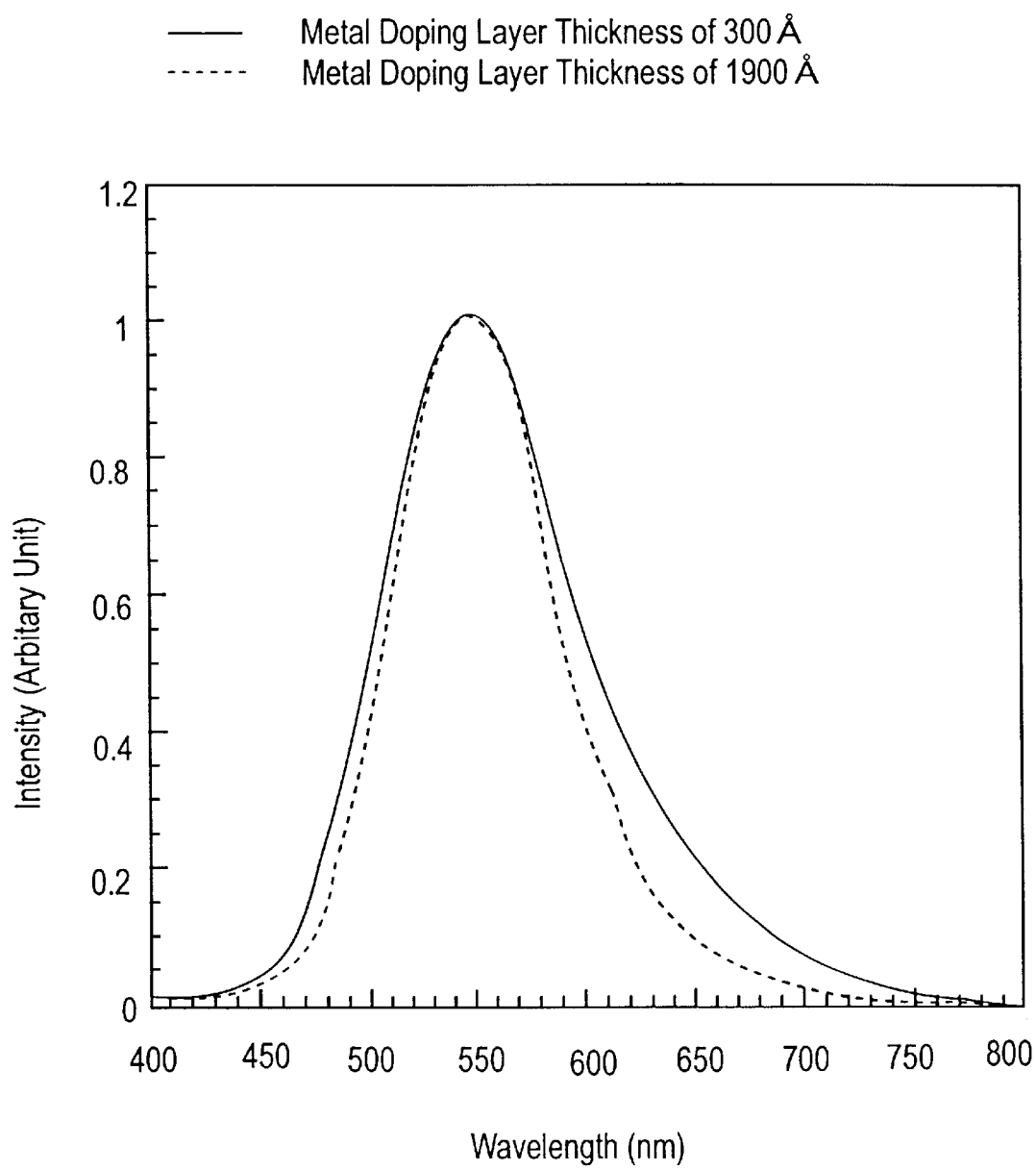
FIG. 4 is a graph showing the emission spectrum of an organic EL device of the first embodiment of the present invention.

In the graph of FIG. 4, the dotted line indicates the emission spectrum of the metal doping layer at a thickness of about 1,900 Å, and the comparison of the dotted line with the solid line, indicating the emission spectrum of the metal doping layer at a thickness of about 300 Å, bears evidence that the color purity can be improved with the increase of the layer thickness of the metal doping layer.

Figure 6:
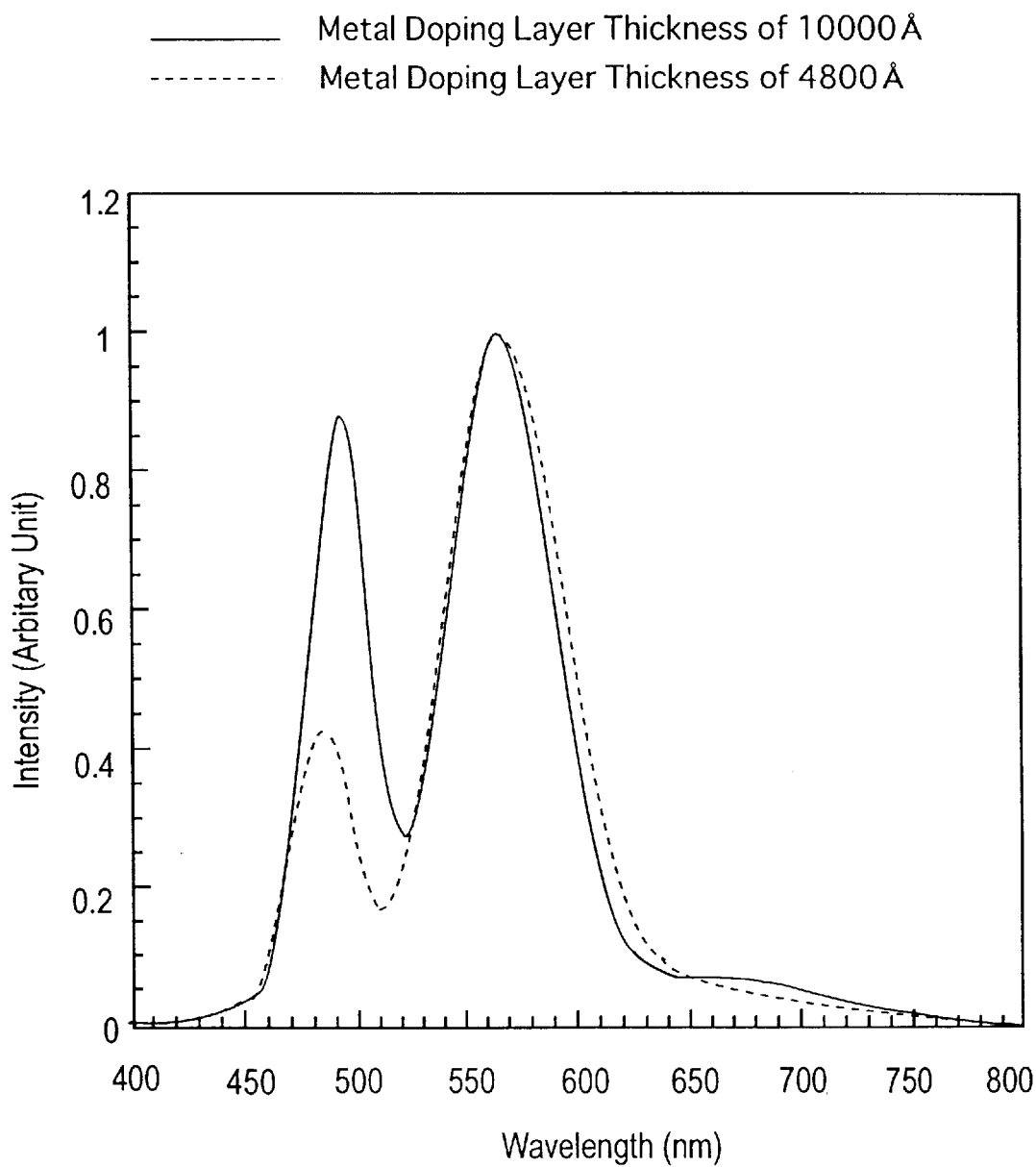
FIG. 6 is a graph showing the emission spectrum of an organic EL device of the first embodiment of the present invention.

Further, FIG. 6 is a graph showing the relationship between the wavelength of the emitted light and its intensity, in which the dotted line and the solid line indicate metal doping layers at a thickness of about 4,800 Å and 10,000 Å, respectively. It is appreciated from this graph that a color tone of the light can be largely modified due to the interference effect with the reflected light on the cathode electrode.

Example 3

The procedure of Example 2 was repeated to produce an organic EL device with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 400 Å.

Thereafter, to obtain metal doping layers 5 having different layer thicknesses, bathocuproine represented by the following formula (IV) and lithium in a molar ratio of 1:1 were co-deposited under the controlled deposition rate to obtain the described molar ratio onto the luminescent layer 4. Three metal doping layers 5 having the thicknesses of about 1,900 Å, 4,800 Å and 10,000 Å (1 μm) were thus obtained:

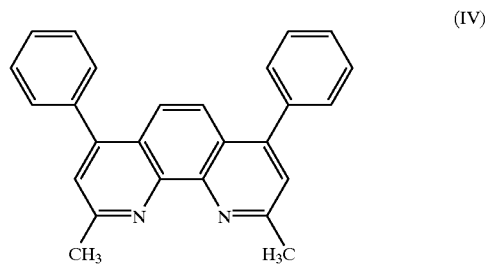

(IV)

Then, aluminum (Al) was deposited at a thickness of about 1,000 Å on the metal doping layer 5 to form a cathode electrode 6.

The thus produced organic EL device was tested to obtain the results plotted in FIG. 5 showing the relationship between the bias voltage and the current density of the device. Note, in this graph, Symbols D, E and F represent metal doping layers having the layer thicknesses of 1,900 Å, 4,800 Å and 10,000 Å (1 μm), respectively.

It was found from the above tests that if bathocuproine is used in place of bathophenanthroline as the organic compound in the formation of the metal doping layer 5 of the EL device, the driving voltage of the device is not increased with the increase of the layer thickness of the layer 5 as it has been already confirmed in the device of Example 2, since bathocuproine has a function of acting as a ligand with respect to the metal ion to be doped into the layer 5. Further, the observation of the emission spectrum indicated that, as in the device of Example 2, the emission spectrum from Alq was modified due to the interference effect with the reflected light on the cathode electrode, thereby enabling to control a purity and tone of the color of the emitted light.

Comparative Example 2

The procedures of Examples 2 and 3 were repeated to produce an organic EL device with the proviso that, for the purpose of comparison, α-NPD was first deposited onto the ITO-coated glass substrate 1 to form a hole transportation layer 3 having a thickness of about 500 Å, followed by vacuum deposition of Alq to form a luminescent layer 4 having a thickness of about 400 Å. Thereafter, to obtain metal doping layers 5 having different layer thicknesses, Alq and lithium in a molar ratio of 1:1 were co-deposited under the controlled deposition rate to obtain the described molar ratio onto the luminescent layer 4. Two metal doping layers 5 having the thicknesses of about 300 Å and 800 Å were thus obtained. Finally, aluminum (Al) was deposited at a thickness of about 1,000 Å over the metal doping layer 5 to form a cathode electrode 6. Organic EL devices were thus obtained.

The produced organic EL devices were tested to obtain the results plotted in FIG. 5 showing the relationship between the bias voltage and the current density of the device. Note, in this graph, Symbols G and H represent metal doping layers having the layer thicknesses of 300 Å and 800 Å, respectively.

It was found from the above tests that if Alq is used as the organic compound in the formation of the metal doping layer 5 of the EL device, a driving voltage of the device can be gradually shifted to a high voltage value with the increase of the layer thickness of the layer 5 in contrast to the devices using bathophenanthroline or bathocuproine as the organic compound in the metal doping layer 5, i.e., the driving voltage of the EL device is dependent upon the thickness of the layer 5.

As can be understood from the results of the above examples, if a compound capable of acting as a ligand to an ion of metal(s) to be doped, for example, bathophenanthroline and bathocuproine used as an organic compound in the metal doping layer of the EL devices, it becomes possible to effectively cause the reduction reaction of the organic compound to produce radical anions, thereby cancelling a dependency of the driving voltage of the device upon the thickness of the metal doping layer, along with free control of the emission spectrum of light emitted from the device.

Examples According to the Second Aspect of the Present Invention

In the following examples, the second aspect of the present invention will be described. Note, in these examples, vapor deposition of the organic compound and the metal was carried out by using the vapor deposition apparatus described above with regard to the first aspect of the present invention. Similarly, the mesuring devices and methods of the device characteristics and others used herein are the same as those described above with regard to the first aspect of the present invention.

Example 4

The organic EL device having the lamination structure illustrated in FIG. 7 was produced according to the second aspect of the present invention.

A glass substrate 21 was coated with an ITO (indium-tin oxide) layer having a sheet resistance of about 25 Ω/□, commercially available as a sputtered product from Sanyou Shinkuu Co., to form a transparent anode electrode 22. Alpha (α)-NPD having a hole transporting property, represented by the above formula (I), and ferric chloride ($FeCl_3$) were deposited in a molar ratio of 1:2 onto the ITO-coated glass substrate 21 under vacuum of about $10^{-6}$ Torr and at the deposition rate of about 3 Å/sec to form three chemical doping layers 23 having thicknesses of about 1,000 Å, 2,000 Å and 3,000 Å respectively.

After formation of the chemical doping layer 23, α-NPD, described above, was deposited under the same vacuum vapor deposition conditions as in the above-described deposition of the chemical doping layer 23 to form a hole transportation layer 24 having a thickness of about 500 Å.

Subsequently, Alq, represented by the above formula (II), was deposited onto the hole transportation layer 24 under the same vacuum vapor deposition conditions as in the above-described deposition of the hole transportation layer 24 to form a luminescent layer 25 having a thickness of about 700 Å.

Finally, aluminum (Al) was deposited at the deposition rate of about 15 Å/sec onto the luminescent layer 25 to form a cathode electrode 26 having a thickness of about 1,000 Å. The organic EL device having a square luminescent area of about 0.5 cm (length) by about 0.5 cm (width) was thus obtained.

Figure 8:
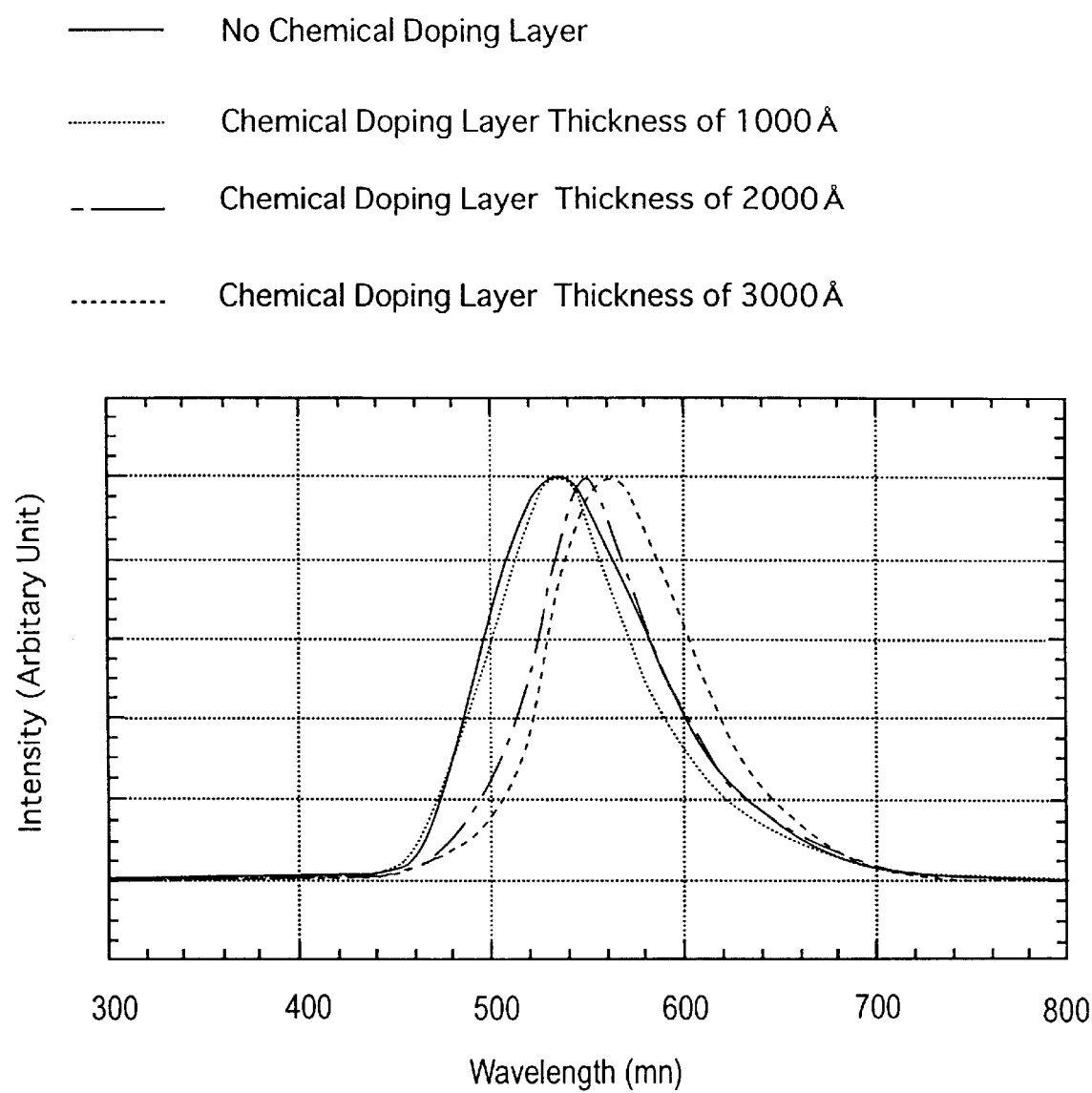
FIG. 8 is a graph showing the emission spectrum of an organic EL device of the second embodiment of the present invention.
Figure 9:
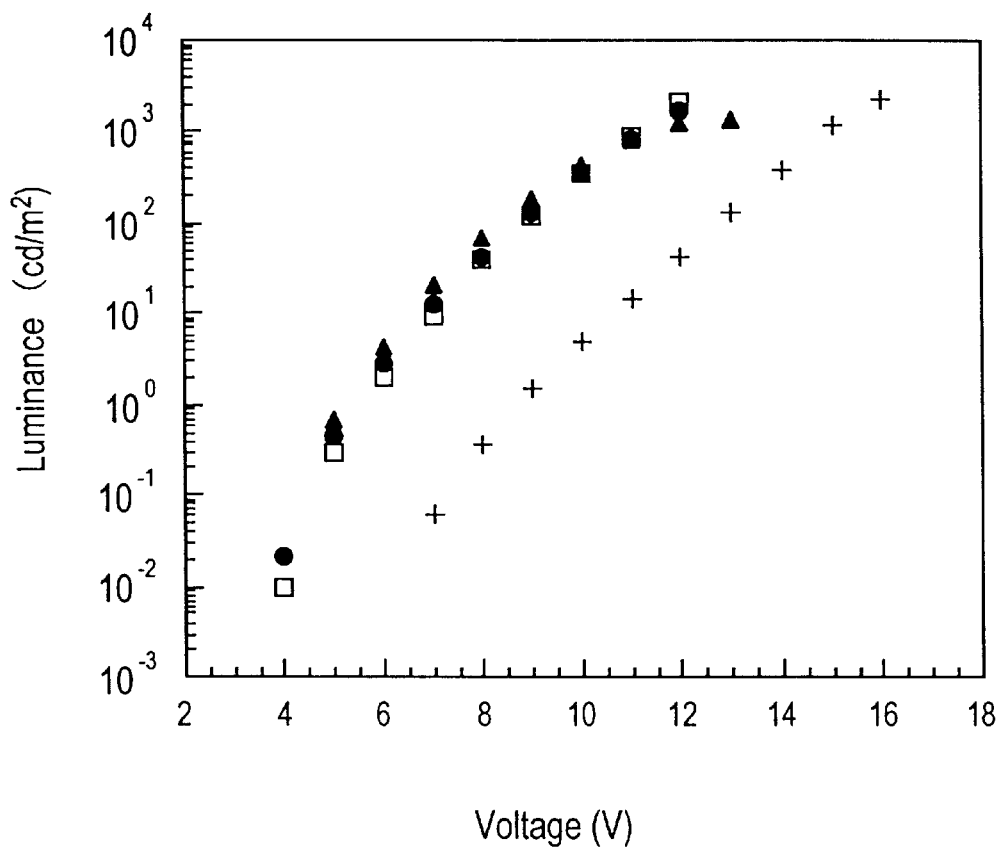
FIG. 9 is a graph showing the relationship between the bias voltage and the luminance for an organic EL device of the second embodiment of the present invention and an organic EL device of a comparative example.
Figure 10:
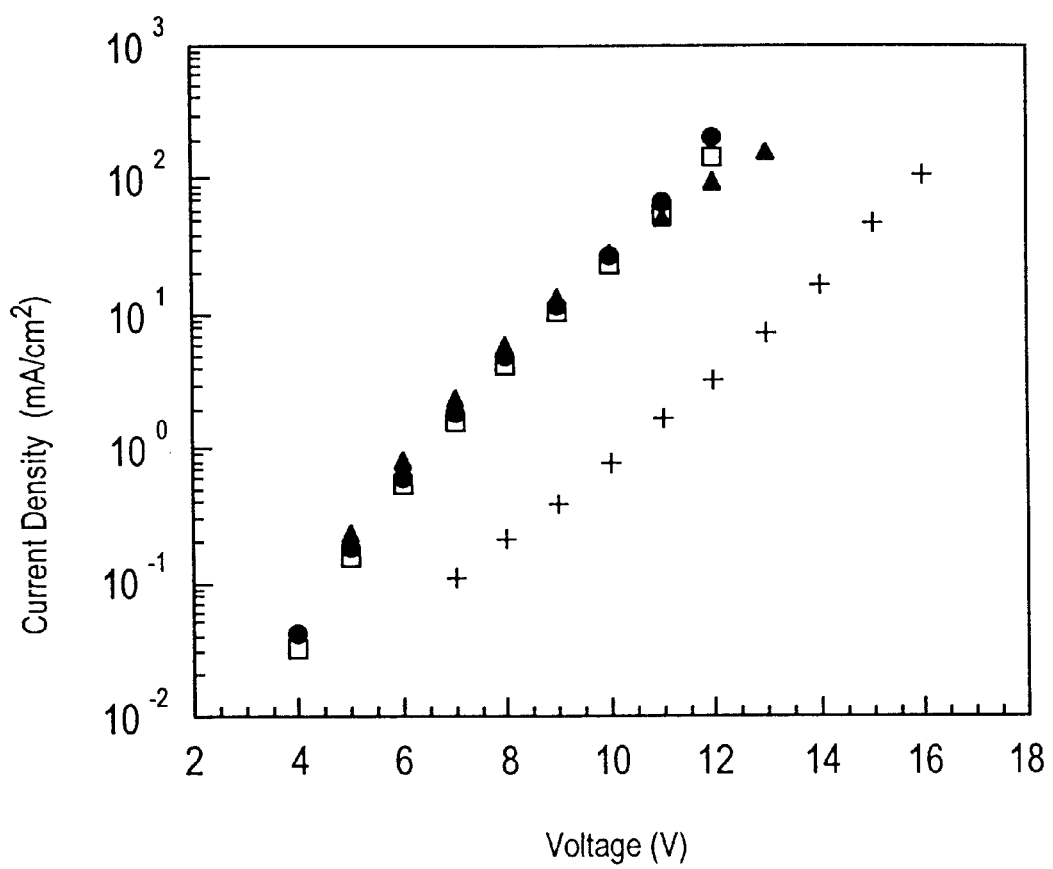
FIG. 10 is a graph showing the relationship between the bias voltage and the current density for an organic EL device of the second embodiment of the present invention and an organic EL device of a comparative example.

In the produced organic EL device, a DC voltage was applied between the transparent anode electrode (ITO) 22 and the cathode electrode (Al) 26, and the luminescence from the luminescent layer (Alq) 25 was determined to obtain the results plotted in FIGS. 8, 9 and 10.

FIG. 8 is a graph showing the relationship between the wavelength of the emitted light and its intensity in which three dotted lines indicate the emission spectrums of light emitted from the devices having the chemical doping layers with the thicknesses of about 1,000 Å, 2,000 Å and 3,000 Å, respectively, and the solid line indicates the emission spectrum of light emitted from the device having no chemical doping layer. Comparing these emission spectrums, it can be understood that when the luminescent layer is made from the same material (Alq), a wavelength and a half-value of the peak can be varied with the change of the layer thickness of the chemical doping layer.

FIG. 9 is a graph showing the relationship between the applied voltage and the luminance, and FIG. 10 is a graph showing the relationship between the applied voltage and the current density. In FIGS. 9 and 10, the Symbols A, B, C and D represent EL devices having chemical doping layers at about 3,000 Å, 2,000 Å and 1,000 Å, and no chemical doping layer, respectively. It can be appreciated from FIGS. 9 and 10 that if the organic EL devices have a chemical doping layer, an increase of the driving voltage thereof can be prevented, even if a thickness of the chemical doping layer is increased, and at the same time, a color tone of the emitted light can be effectively controlled.

In these examples, the formation of the chemical doping layer was explained with reference to doping, through co-deposition in a vacuum, of an organic compound (α-NPD) and an electron-accepting compound ($FeCl_3$). However, if it can be formed from its coating solution, the chemical doping layer may be formed by using a coating method such as spin coating and dip coating. Namely, the organic compound and the electron-accepting compound are dispersed (reacted) in a solvent to form a coating solution, followed by coating the coating solution onto a transparent anode electrode to form a chemical doping layer. In this coating method, a polymeric compound may be used as the organic compound. A suitable polymeric compound includes, for example, polyvinyl carbazole. In such a case, it is also preferred that the electron-accepting compound is used in a molar ratio of 0.1 to 10 with respect to an active unit of the polymeric compound.

As described above with regard to the examples of the first and second aspects of the present invention, using the organic EL device of the present invention, an emission spectrum of light emitted from the device can be controlled by varying a layer thickness of the metal doping layer or the chemical doping layer of the device. Accordingly, if the metal doping layer or the chemical doping layer is divided into two or more areas so that the divided areas have different thicknesses to each other, an organic EL device capable of emitting color in each of the divided areas can be produced.

Figure 11:
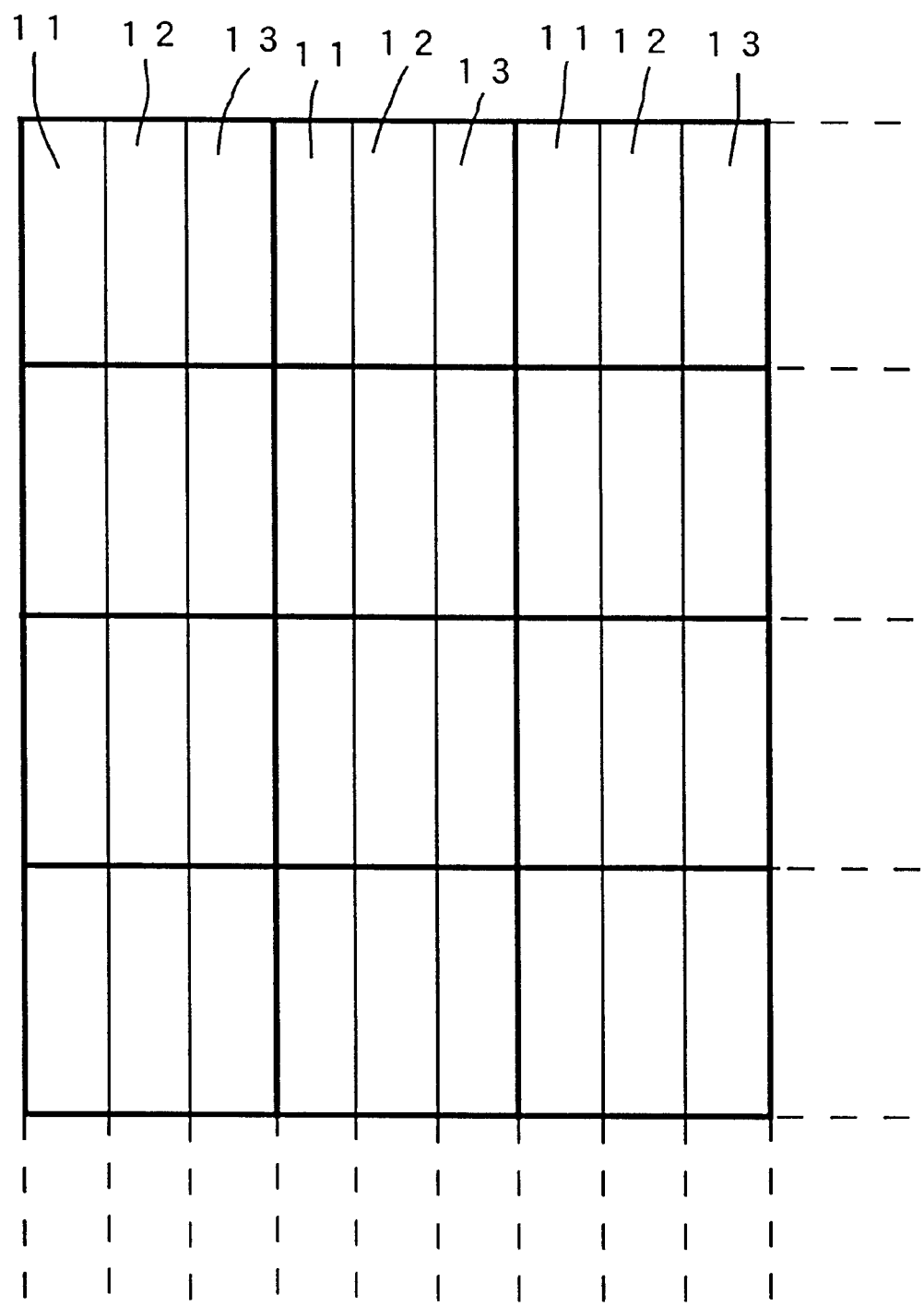
FIG. 11 is a schematic view showing the picture elements of a color display device.

Furthermore, a color display system can be provided, if the divided areas of the metal doping layer or the chemical doping layer is constituted from a group of a plurality of picture elements, arranged in a matrix form, in which the picture elements have different thicknesses to obtain a variation of the color. One example of such a color display system is illustrated in FIG. 11, in which three picture elements 11, 12 and 13 each having predetermined layer thickness are lengthwise and breadthwise arranged to obtain the emitted lights of R (red), G (green) and B (blue). The illustrated system can display color images or movies upon selective application of the driving voltage to the picture elements of the system in accordance with a color displaying method for color CRT displays and color liquid crystal displays known in the art.

Although the invention has been described with reference to particular means, materials and embodiments, it is to be understood that the invention is not limited to the particulars disclosed and extends to all equivalents within the scope of the claims.

What is claimed is:

1. An organic electroluminescent device comprising:
   at least one luminescent layer, constituted from an organic compound, provided between a cathode electrode and an anode electrode opposed to said cathode electrode; and
   an organic compound layer doped with a metal capable of acting as an electron-donating dopant, said organic compound layer being disposed as a metal doping layer in an interfacial surface with said cathode electrode; wherein
      an emission spectrum of light emitted from said organic electroluminescent device depends on a layer thickness of said metal doping layer.

2. The organic electroluminescent device according to claim 1, wherein said metal doping layer comprises at least one metal selected from an alkali metal, an alkali earth metal and transition metals including a rare earth metal, said metal having a work function of not more than 4.2 eV.

3. The organic electroluminescent device according to claim 1, wherein said metal is included in said metal doping layer by a molar ratio of 0.1 to 10 with respect to said organic compound.

4. The organic electroluminescent device according to claim 1, wherein said metal doping layer has a layer thickness of not less than 500 angstroms.

5. The organic electroluminescent device according to claim 1, wherein the organic compound in said metal doping layer can act as a ligand to an ion of said metal in said metal doping layer.

6. The organic electroluminescent device according to claim 1, wherein said metal doping layer comprises at least a first and a second divided area, said metal doping layer having a first thickness in said first divided area and a second thickness that differs from the first thickness in the second area.

7. The organic electroluminescent device according to claim 6, wherein said divided areas each comprises a group of picture elements arranged in a matrix form.

8. The organic electroluminescent device according to claim 6, wherein each of said divided areas has a controlled layer thickness to obtain a specific emission spectrum in each divided area.

9. A group of organic electroluminescent devices, each organic electroluminescent device comprising:
   at least one luminescent layer, constituted from an organic compound, provided between a cathode electrode and an anode electrode opposed to the cathode electrode; and
   an organic compound layer doped with a metal capable of acting as an electron-donating dopant, said organic compound layer being disposed as a metal doping layer in an interfacial surface with said cathode electrode; wherein
      a layer thickness of said metal doping layer is controlled in each organic electroluminescent device so that light emitted from said each organic electroluminescent device has different emission spectrums.

10. The group of organic electroluminescent devices according to claim 9, wherein said metal doping layer comprises at least one metal selected from an alkali metal, an alkali earth metal and transition metals including a rare earth metal, said metal having a work function of not more than 4.2 eV.

11. The group of organic electroluminescent devices according to claim 9, wherein said metal doping layer comprises said metal in a molar ratio of 0.1 to 10 with respect to said organic compound.

12. The group of organic electroluminescent devices according to claim 9, wherein said metal doping layer has a layer thickness of not less than 500 angstroms.

13. The group of organic electroluminescent devices according to claim 9, wherein the organic compound in said metal doping layer can act as a ligand to an ion of said metal in said metal doping layer.

14. A method of controlling an emission spectrum of light emitted from an organic electroluminescent device which comprises at least one luminescent layer, constituted from an organic compound, provided between a cathode electrode and an anode electrode opposed to said cathode electrode, and an organic compound layer doped with a metal capable of acting as an electron-donating dopant disposed as a metal doping layer in an interfacial surface with said cathode electrode on the luminescent layer side, said method comprising:
   varying a layer thickness of said metal doping layer to control an emission spectrum of light emitted from said organic electroluminescent device.

15. The controlling method according to claim 14, wherein a layer thickness of said metal doping layer is varied to control an emission spectrum of light in two or more organic electroluminescent devices, while said organic electroluminescent devices are operated at a substantially the same driving voltage regardless of the layer thickness of said metal doping layer in each organic electroluminescent device.

16. An organic electroluminescent device comprising:
   at least one luminescent layer, constituted from an organic compound, provided between a cathode electrode and an anode electrode opposed to said cathode electrode; and
   an organic compound layer doped with an electron-accepting compound, having properties of a Lewis acid, disposed as a chemical doping layer in an interfacial surface with said anode electrode on the luminescent layer side; wherein
      an emission spectrum of light emitted from said organic electroluminescent device depends on a layer thickness of said chemical doping layer.

17. The organic electroluminescent device according to claim 16, wherein said chemical doping layer is a layer of organic compound formed upon doping, through co-deposition in a vacuum, of said electron-accepting compound.

18. The organic electroluminescent device according to claim 16, wherein said chemical doping layer is a layer of organic compound formed upon depositing a coating solution which is prepared by reacting an organic compound, constituting said organic compound layer, and said electron-accepting compound in a solution.

19. The organic electroluminescent device according to claim 18, wherein said organic compound constituting said organic compound layer is a polymer.

20. The organic electroluminescent device according to claim 16, wherein said organic compound layer comprises said electron-accepting compound by a molar ratio of 0.1 to 10 with respect to said organic compound constituting said organic compound layer.

21. The organic electroluminescent device according to claim 19, wherein said organic compound layer comprises said electron-accepting compound by a molar ratio of 0.1 to 10 with respect to an active unit of said polymer constituting said organic compound layer.

22. The organic electroluminescent device according to claim 16, wherein said chemical doping layer has a layer thickness of not less than 50 angstroms.

23. The organic electroluminescent device according to claim 16, wherein said electron-accepting compound comprises an inorganic compound.

24. The organic electroluminescent device according to claim 23, wherein said inorganic compound comprises at least one member selected from a group consisting of ferric chloride, aluminum chloride, gallium chloride, indium chloride and antimony pentachloride.

25. The organic electroluminescent device according to claim 16, wherein said electron-accepting compound comprises an organic compound.

26. The organic electroluminescent device according to claim 25, wherein said organic compound comprises trinitrofluorenone.

27. The organic electroluminescent device according to claim 16, wherein said chemical doping layer comprises divided areas having different layer thicknesses.

28. The organic electroluminescent device according to claim 27, wherein each of said divided areas comprises a group of picture elements arranged in a matrix form.

29. The organic electroluminescent device according to claim 27, wherein each of said divided areas has a controlled layer thickness to obtain a specific emission spectrum in each divided area.

30. A group of organic electroluminescent devices, each organic electroluminescent device comprising:
at least one luminescent layer, constituted from an organic compound, provided between a cathode electrode and an anode electrode opposed to said cathode electrode; wherein
said organic electroluminescent devices each comprises an organic compound layer, as a chemical doping layer, doped with an electron-accepting compound having properties of a Lewis acid, said organic compound layer being disposed in an interfacial surface with said anode electrode on the luminescent layer side of said organic electroluminescent device; and wherein
in said each organic electroluminescent device, light emitted from said organic electroluminescent device has different emission spectrum in accordance with a layer thickness of said metal doping layer.

31. The group of organic electroluminescent devices according to claim 30, wherein said chemical doping layer is a layer of organic compound formed upon doping, through co-deposition in a vacuum, of said electron-accepting compound.

32. The group of organic electroluminescent devices according to claim 30, wherein said chemical doping layer is a layer of organic compound formed upon coating a coating solution which is prepared by reacting an organic compound constituting said organic compound layer and said electron-accepting compound in a solution.

33. The group of organic electroluminescent devices according to claim 32, wherein said organic compound constituting said organic compound layer is a polymer.

34. The group of organic electroluminescent devices according to claim 30, wherein said organic compound layer comprises said electron-accepting compound by a molar ratio of 0.1 to 10 with respect to said organic compound constituting said organic compound layer.

35. The group of organic electroluminescent devices according to claim 33, wherein said organic compound layer comprises said electron-accepting compound by a molar ratio of 0.1 to 10 with respect to an active unit of said polymer constituting said organic compound layer.

36. The group of organic electroluminescent devices according to claim 30, wherein said chemical doping layer has a layer thickness of not less than 50 angstroms.

37. The group of organic electroluminescent devices according to claim 30, wherein said electron-accepting compound comprises an inorganic compound.

38. The group of organic electroluminescent devices according to claim 30, wherein said electron-accepting compound comprises an organic compound.

39. A method of controlling an emission spectrum of light emitted from an organic electroluminescent device which comprises at least one luminescent layer, constituted from an organic compound, provided between a cathode electrode and an anode electrode opposed to said cathode electrode; and an organic compound layer, as a chemical doping layer, doped with an electron-accepting compound, having properties of a Lewis acid, disposed in an interfacial surface with said anode electrode on the luminescent layer side, said method comprising:
varying a layer thickness of said chemical doping layer to control an emission spectrum of light emitted from said organic electroluminescent device.

40. The method of controlling an emission spectrum of light emitted from an organic electroluminescent device according to claim 39, wherein a layer thickness of said chemical doping layer is varied to control an emission spectrum of light in two or more organic electroluminescent devices, while said organic electroluminescent devices are operated at a substantially same driving voltage regardless of the layer thickness of said chemical doping layer in each organic electroluminescent device.

* * * * *